United States Patent [19]

Person

[11] Patent Number: 4,641,114

[45] Date of Patent: Feb. 3, 1097

[54] THICK FILM DELAY LINE COMPRISING A PLURALITY OF STACKED DELAY ASSEMBLIES FORMED BY A PRINTING PROCESS

[75] Inventor: Herman R. Person, Columbus, Nebr.

[73] Assignee: Dale Electrons, Inc., Columbus, Nebr.

[21] Appl. No.: 761,598

[22] Filed: Jul. 31, 1985

Related U.S. Application Data

[63] Continuation of Ser. No. 478,841, Mar. 25, 1983, abandoned.

[51] Int. Cl.[4] .................................................. H01P 9/00
[52] U.S. Cl. ...................... 333/161; 336/200; 336/232; 361/402; 361/412; 174/52 PE; 174/68.5
[58] Field of Search ................. 333/140, 161, 23, 185, 333/204, 172; 336/200, 232; 29/602 R, 829, 831, 832, 841, 842, 852; 361/402, 403, 399, 413, 415, 417, 418; 174/52 PE, 50.5, 68.5; 339/17 LM, 17 M, 17 N

[56] References Cited

U.S. PATENT DOCUMENTS

| | | | |
|---|---|---|---|
| 2,832,935 | 4/1958 | Tank | 333/140 |
| 3,484,654 | 12/1969 | Honeiser | 336/200 |
| 3,490,055 | 1/1970 | Cox | 361/402 X |
| 3,785,046 | 1/1974 | Jennings | 336/200 X |
| 4,183,074 | 1/1980 | Wallace | 336/200 X |
| 4,313,151 | 1/1982 | Vranken | 361/402 |
| 4,313,152 | 1/1982 | Vranken | 361/402 |
| 4,342,143 | 8/1982 | Jennings | 336/200 X |

FOREIGN PATENT DOCUMENTS

| | | |
|---|---|---|
| 1150721 | 3/1963 | Fed. Rep. of Germany . |
| 2363220 | 6/1974 | Fed. Rep. of Germany .... 29/602 R |
| 2379229 | 9/1978 | France ................................. 336/200 |

OTHER PUBLICATIONS

IBM Bulletin—Printed Delay Line, Oct. 1965; vol. 8, No. 5, p. 741.

*Primary Examiner*—Eugene R. LaRoche
*Assistant Examiner*—Benny T. Lee
*Attorney, Agent, or Firm*—Zarley, McKee, Thomte, Voorhees & Sease

[57] ABSTRACT

The thick film delay line of the present invention comprises a substrate having a plurality of conductive pads mounted along the edge thereof. A plurality of delay circuit assemblies are stacked on the upper surface of the substrate. Each delay circuit comprises a solid sheet of conductive material, a first layer of dielectric material superimposed over the solid conductor sheet, a spiral coil conductor having its opposite ends connected to two separate contact pads, and a second sheet of dielectric material covering the spiral conductor. The spiral conductors within each of the delay circuit assemblies are connected to one another in series.

3 Claims, 11 Drawing Figures

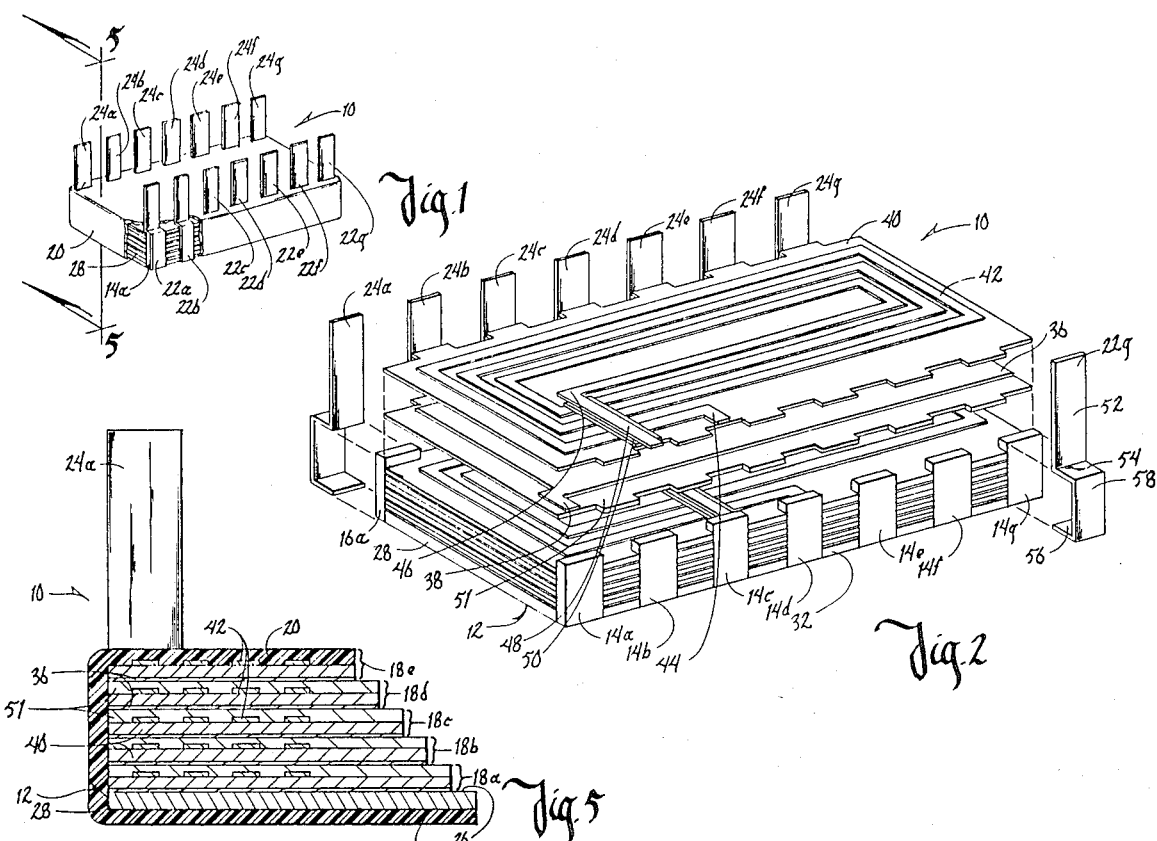
Fig. 1
Fig. 2
Fig. 5
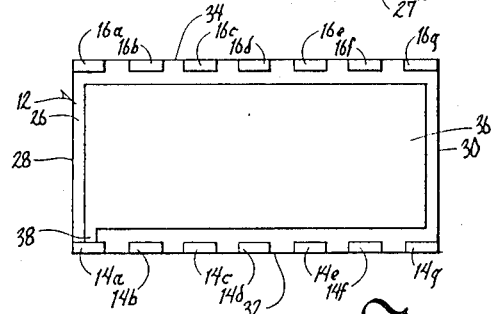
Fig. 3A
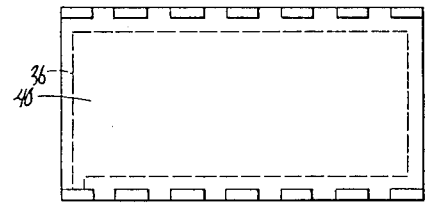
Fig. 3B
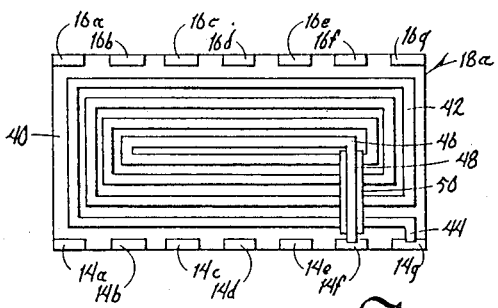
Fig. 3C
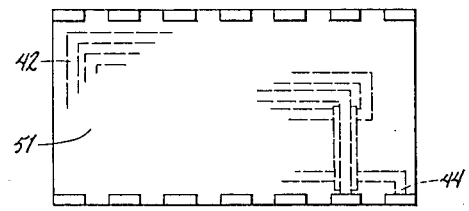
Fig. 3D

THICK FILM DELAY LINE COMPRISING A PLURALITY OF STACKED DELAY ASSEMBLIES FORMED BY A PRINTING PROCESS

This is a continuation of Ser. No. 478,841, filed Mar. 25, 1983, now abandoned.

BACKGROUND OF THE INVENTION

This invention relates to a miniature delay line which is made with thick film manufacturing techniques. The device is small and can be used in an active delay line in combination with other components such as an amplifier or a passive delay line where it is used alone without any other components.

Prior delay lines have been provided, but these previous devices have certain deficiencies. The manufacturing techniques of these prior designs make it difficult to mass produce them in large quantities easily and quickly. Present techniques for manufacturing these prior art devices do not utilize the printing of thick film. Furthermore, many of the prior art devices occupy a considerable amount of space and are not readily adaptable to miniature circuits.

Another problem encountered with prior designs is their susceptibility to damage when exposed to shock or vibration. Often these prior devices exhibit changes in their electrical characteristics once they are exposed to shock or vibration.

Another problem encountered with prior devices is their lack of flexibility. They are usually constructed so that they are capable of providing only a single delay time, and they are not usually capable of providing a plurality of different delay times according to the needs of the particular circuit in which they are used.

Therefore, a primary object of the present invention is the provision of an improved miniature delay line.

A further object of the present invention is the provision of a delay line which is manufactured by techniques which permit it to be mass produced in large quantities easily and quickly.

A further object of the present invention is the provision of a delay line which can be manufactured with a minimum amount of materials for a very low cost.

A further object of the present invention is the provision of a delay line which can be manufactured through the use of thick film techniques so as to greatly reduce the labor involved in making the part.

A further object of the present invention is the provision of a delay line which can be made in a very small space.

A further object of the present invention is the provision of a delay line which is rigid and which is able to absorb shock and vibration without changing its electrical characteristics.

A further object of the present invention is the provision of a delay line which can be manufactured using conventional thick film manufacturing techniques and conventional thick film materials and equipment.

A further object of the present invention is the provision of a delay line which can be manufactured in such a form that different delay times can be tapped from a single part.

A further object of the present invention is the provision of a device which is economical to manufacture, durable in use and efficient in operation.

SUMMARY OF THE INVENTION

The delay line of the present invention comprises a ceramic substrate on which a plurality of delay circuits are printed on top of one another. Each delay circuit comprises a solid conductor pattern which is printed on the substrate to form the ground side of the distributed capacitance of the delay line. Next, a first dielectric layer is printed on top of the solid pattern so that its capacitance or dielectric constant is correct to form the desired electrical characteristics for the delay line. On top of this first dielectric layer a spiral conductor pattern is printed with the outer spiral end being connected to one terminal on the edge of the substrate and with the inner spiral end being connected to a second terminal on the edge of the substrate. In order to bring the inner end of the spiral to the outer edge of the substrate, it is necessary to cross the inner end over a portion of the spiral conductor. A small dielectric layer is interposed between the inner end of the spiral and the crossed over portion of the spiral so as to prevent electrical contact therebetween.

A second dielectric layer is then printed over the top of the spiral so that the spiral is completely covered.

A second delay circuit is provided by printing a second solid conductor pattern on top of the first delay circuit and then proceeding with the similar laminated pattern which is provided for the first delay circuit. A plurality of delay circuits may be stacked over one another in this fashion.

All of the solid conductor sheets of the various delay lines are connected in common to a ground terminal. However, the spiral conductors of the various delay circuits are connected in series with one another with the inner spiral end of one delay circuit being connected in common with the outer spiral end of an adjacent delay circuit. Thus, by tapping different combinations of terminals on the edge of the device, it is possible to vary the amount of delay provided by the delay circuits. For example, it is possible to tap off of delay 1 and 2 without using delays 2 through 5. As an alternative, it is possible to tap off of delays 1 through 5 and thereby obtain the benefit of the entire combination of delay circuits.

The flat coils of the various circuits are stacked upon one another, thereby causing mutual inductances between the coils. This mutual inductance causes the total inductance of the combined stacked coils to be greater than the sums of the individual inductances of the coils taken separately.

The delay line can easily be manufactured in large numbers by printing the parts on an elongated snap-apart substrate. A snap-apart substrate is an elongated ceramic substrate having pre-scribed lines thereon so that it can be broken apart into as many as twenty to forty parts after printing and firing of the delay line circuits.

The delay line of the present invention may be utilized as an active delay line by addition of an inverter on each input and output of the delay line. The inverter can be made with fourteen pins arranged to complement the fourteen pins of the delay line. With this arrangement the delay line and the inverter can be connected in a "piggy back" configuration so as to form a single package.

BRIEF DESCRIPTION OF THE DRAWINGS

FIG. 1 is a perspective view of the delay line of the present invention.

FIG. 2 is a view similar to FIG. 1 with portions of the delay line broken away to show the interior thereof.

FIGS. 3a-3d are views showing the various layers within one delay line circuit.

FIG. 5 is a partial sectional view showing the various delay circuits in section.

DETAILED DESCRIPTION OF THE PREFERRED EMBODIMENT

Figure 4A:
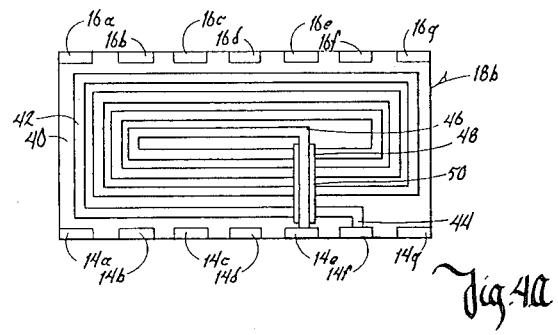
FIGS. 4a-4d are figures showing the arrangement of the various coil conductors in three separate delay circuits within the delay line of the present invention.

Referring to FIGS. 1-3 of the drawings, the numeral 10 generally designates the delay line of the present invention. Delay line 10 comprises a substrate 12, a plurality of contact pads 14a-14g, and 16a-16g, and a plurality of delay circuit assemblies 18a-18e. The device in FIG. 1 is shown to be coated with a dielectric encapsulating material 20 which coats the entire outside of the device and which protects the interior components from outside influences. A plurality of leads 22a-22g and 24a-24g are in electrical contact with contacts 14a-14g and 16a-16g, respectively, and extend upwardly out of the encapsulating material 20 as shown in FIG. 1.

While the device 10 shown in FIG. 1 is shown coated with a dielectric material 20, device 10 may also be embedded or potted within a molded material in combination with other components such as transistors, resistors, etc.

Substrate 12 is preferably of rectangular configuration having an upper surface 26, a lower surface 27, a pair of opposite end edges 28, 30 and a pair of opposite side edges 32, 34.

Mounted on upper surface 26 is the first delay circuit assembly 18a which is in detail in FIGS. 3a-3d. The bottom-most layer of delay circuit 18a comprises a solid sheet of conductive material 36 which is printed on the upper surface 26 of substrate 12 by conventional means. A conductive lead line 38 is also printed on surface 26 and connects sheet 36 with contact at 14a.

FIG. 3b shows the second step in the process of manufacturing delay circuit 18a. A first dielectric layer 40 is placed over solid conductor 36 so as to completely cover the same. The choice of thickness and material for the dielectric is made so that its capacitance or dielectric constant is correct to form the desired electrical characteristics for the delay line. The proper choice of thickness and material for the dielectric is a process which is well known in the art.

FIG. 3c shows the third step in the manufacturing of delay circuit 18a. A spiral conductor 42 is printed over the first dielectric layer 40 and includes an outer spiral end 44 which is electrically connected to contact pad 14g and an inner spiral end 46 which is connected to contact pad 14f, by means of a cross-over lead 48 which crosses over a portion of the spiral conductor 42 so as to interconnect inner spiral end 46 to contact pad 14f. A small dielectric patch 50 is interposed between cross-over lead 48 and the portion of the spiral conductor 46 over which lead 48 passes so as to prevent electrical contact therebetween.

FIG. 3d shows the final step in the process of constructing delay circuit 18a. A second dielectric layer 51 is superimposed over the entire spiral conductor 42 in covering so as to completely cover the same.

Figure 4B:
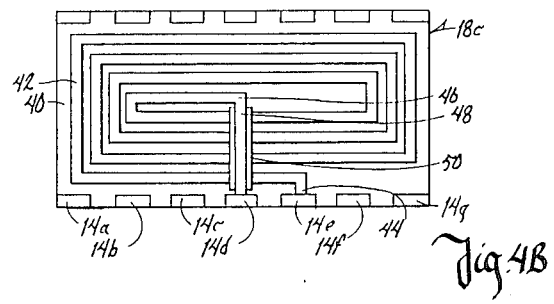
Figure 4C:
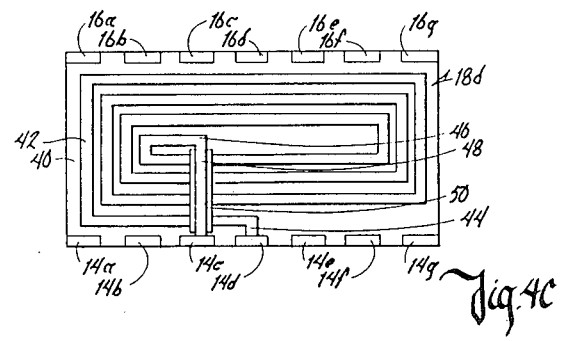
Figure 4D:
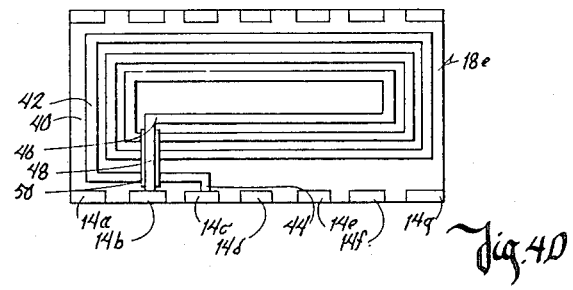

Delay circuit 18b is constructed in the same fashion as delay circuit 18a and is built upon the dielectric layer 51 shown in FIG. 3d. The only difference between delay circuit 18b and delay circuit 18a, is the manner in which the inner and outer coil ends 44, 46 are connected to the contact pads. As can be seen in FIGS. 4a-4d, the spiral conductors 42 of these various circuits are connected in series with one another. Spiral conductor 42 of circuit 18a (FIG. 3c) has its outer end connected to contact pad 14g and its inner end connected to contact pad 14f. Circuit 18b (FIG. 4a) has its outer spiral end 44 connected to contact pad 14f and its inner end 46 connected to contact pad 14e. Circuit 18c (FIG. 4b) has the outer spiral end 44 connected to contact pad 14e and its inner spiral end 46 connected to contact pad 14d.

Circuit 18d has its outer spiral end 44 connected to contact pad 14d and its inner spiral end 44 connected to contact pad 14c. Circuit 18e has its outer spiral end 44 connected to contact pad 14c and its inner spiral end connected to contact pad 14b. Thus, it can be seen that the various circuits 18a-18e are connected in series with one another.

While only five circuits 18a-18e are shown, it is possible to stack as many as 11 different circuits on top of one another utilizing contact pads 14b through 14g and 16a-16g.

Contact pad 14a provides a common terminal for all of the solid sheet conductors 36 of the various circuits 18a-18 e. Thus, sheets 36 may be connected to a common ground to form the ground side of the distributed capacitance within the delay line 10.

A plurality of leads 22a-22g and 24a-24g can be connected in conventional fashion to contact pads 14a-14g and 16a-16g, respectively. The particular configuration of the leads 22, 24 can be varied without detracting from the invention. One form is shown in the drawing (FIG. 2) which includes a vertical lead stem 52 having at its lower end a C-shaped member formed from an upper horizontal leg 54, a lower horizontal leg 56, and an innerconnecting vertical leg 58. Legs 54, 56 embrace the upper surface of each contact pad 14 and the lower surface of substrate 12 therebetween in a spring-like fashion, so as to provide a tight frictional fit. Further securement may be provided by soldering or other conventional methods. While the leads 22 are shown to have upstanding members 52 extending upwardly from the upper surface of delay line 10, these leads may extend either downwardly from the lower surface of the delay line, or they may extend in a line which is parallel to the plane of the substrate, or in any other direction desired without detracting from the invention.

After the leads 22 have been attached, the entire device is encapsulated within a dielectric or plastic coating 20 which provides further securement of the leads 22 to the contact pads 14, 16. Only upstanding members 52 extend outwardly from the encapsulating material or coating 20.

As can be seen from FIG. 2, the thickness of each contact pad 14a-14g and 16a-16g is sufficient to span the vertical height of the various delay circuits 18a-18d. This presents each contact pad 14, 16 at the proper height for coming in contact with the inner and outer spiral ends 44, 46 of each delay circuit 18a-18d.

Using the thick film printing technique described above, it is possible to manufacture 20 to 40 delay lines by printing them all at once on a standard snapstrate which is a large ceramic substrate that has been cut into smaller sections so that they can be broken apart after the printing has been completed. If an active delay line is required, that is, a delay line which is connected with an inverter on each input and output, the part can be connected to the inverter and then molded or potted in a package configuration. Otherwise, the device can be molded as shown in the drawings within plastic coating 20 for use separately apart from other components.

From the foregoing, it can be seen that the manufacturing techniques of the above design allow it to be mass produced in large quantities easily and quickly. The device can be made with a minimum amount of materials for a very low cost, and the thick film technique used in the manufacture of this invention greatly reduces the labor content required for making the part. The delay line can be made in a very small space and the rigidity of the design and manufacturing processes allow the part to be able to absorb shock and vibration with a minimum of change in its electrical characteristics. The device can be manufactured using conventional, presently known thick film manufacturing techniques, materials and equipment.

Another advantage of the present invention is that it permits the user to connect the device so that different delay times can be tapped according to the choice of the user. For example, if the device is tapped by connecting leads 14b and 14g, the entire combined delay achieved by circuits 18a through 18e will be realized. If a shorter delay is desired, it is possible to tap off of leads 14d and 14g or to tap off other combinations of leads which will achieve different delay times. Thus, the device has flexibility which enables it to be used in a wide variety of applications.

Thus, it can be seen that the device accomplishes at least all of its stated objectives.

What is claimed is:

1. A thick film delay line comprising:

a dielectric substrate having an upper surface, a lower surface, and a plurality of perimetric edges;

at least first, second and third delay circuit assemblies, each of said delay circuit assemblies comprising a solid sheet of conductive material, a first printed layer of dielectric material printed over and completely covering said solid conductive sheet, a spiral conductor printed over said first dielectric layer and having an outer spiral end and an inner spiral end, said inner spiral end crossing over a cross-over portion of said spiral conductor, printed dielectric means interposed between said cross over portion of said spiral conductor and said inner spiral end to prevent electrical contact therebetween, and a second printed dielectric layer printed over and completely covering all of said spiral conductor so that said entire spiral conductor is sandwiched between said first and second printed dielectric layers;

said solid conductive sheet of said first delay circuit assembly being printed on said upper surface of said substrate;

said solid conductive sheets of said second and third delay circuit assemblies being printed on said second dielectric layers of said first and second delay circuit assemblies, respectively;

said third delay circuit assembly being positioned a predetermined height above said upper surface of said substrate;

at least a conductive ground contact pad and conductive first, second, third and fourth contact pads mounted to said substrate along one of said peripheral edges thereof in spaced relation to one another, each of said ground, first, second, third and fourth contact pads extending above said upper surface to a height at least equal to said predetermined height of said third delay circuit assembly above said upper surface of said substrate;

said inner and outer coil ends of said first delay circuit assembly extending horizontally from between said first and second dielectric layers of said first delay circuit assembly with one of said inner and outer coil ends of said first delay line being electrically connected to said first contact pad and with the other of said inner and outer coil ends of said first delay line being electrically connected to said second contact pad;

said inner and outer coil ends of said second delay circuit assembly extending horizontally from between said first and second dielectric layers of said second delay circuit assembly with one of said inner and outer coil ends of said second delay circuit assembly being electrically connected to said second contact pad and the other of said inner and outer coil ends of said second delay circuit assembly being connected to said third contact pad;

said inner and outer coil ends of said third delay circuit assembly extending horizontally from between said first and second dielectric layers of said third delay circuit assembly with one of said inner and outer coil ends of said third delay circuit assembly being in electrical contact with said third contact pad and the other of said inner and outer coil ends of said third delay circuit assembly being in electrical contact with said fourth contact pad, whereby said conductive coils of said first, second, and third delay circuit assemblies are connected in series with one another;

each of said conductive sheets of said first, second and third delay assemblies having a horizontal lead extending horizontally into electrical contact with said ground contact pad.

2. A thick film delay line according to claim 1 and further comprising said substrate being rectangular in shape and having opposite end edges and opposite side edges, said contact pads being mounted to said substrate adjacent said opposite side edges.

3. A thick film delay line according to claim 1 wherein a dielectric material surrounds and encapsulates said substrate, said contact pads, and said delay circuit assemblies.

* * * * *